United States Patent
Li et al.

(10) Patent No.: US 10,126,848 B2
(45) Date of Patent: Nov. 13, 2018

(54) TOUCH SUBSTRATE, DISPLAY DEVICE HAVING THE SAME, AND MANUFACTURING METHOD THEREOF

(71) Applicant: BOE TECHNOLOGY GROUP CO., LTD., Beijing (CN)

(72) Inventors: Wusheng Li, Beijing (CN); Zhanfeng Cao, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 232 days.

(21) Appl. No.: 15/030,601

(22) PCT Filed: Dec. 10, 2015

(86) PCT No.: PCT/CN2015/096900
§ 371 (c)(1),
(2) Date: Apr. 20, 2016

(87) PCT Pub. No.: WO2016/188083
PCT Pub. Date: Dec. 1, 2016

(65) Prior Publication Data
US 2018/0136748 A1    May 17, 2018

(30) Foreign Application Priority Data

May 22, 2015 (CN) .......................... 2015 1 0266857

(51) Int. Cl.
*G06F 3/00* (2006.01)
*G06F 3/041* (2006.01)
*B32B 15/01* (2006.01)
*H01L 27/32* (2006.01)

(52) U.S. Cl.
CPC .............. *G06F 3/041* (2013.01); *B32B 15/01* (2013.01); *B32B 2457/208* (2013.01); *G06F 2203/04103* (2013.01); *G06F 2203/04111* (2013.01); *H01L 27/323* (2013.01)

(58) Field of Classification Search
CPC .......... G06F 2203/04103; G06F 3/041; G06F 2203/04111; B32B 15/01; B32B 2457/208
See application file for complete search history.

(56) References Cited

U.S. PATENT DOCUMENTS

2017/0285786 A1* 10/2017 Hondo .................... G06F 3/041

FOREIGN PATENT DOCUMENTS

| CN | 203786714 U | 8/2014 |
|---|---|---|
| CN | 104199575 A | 12/2014 |
| CN | 104820533 A | 8/2015 |
| CN | 104881185 A | 9/2015 |
| JP | 2003279706 A | 10/2003 |

(Continued)

OTHER PUBLICATIONS

International Search Report & Written Opinion dated Feb. 29, 2016 regarding PCT/CN2015/096900.

(Continued)

*Primary Examiner* — Muhammad N Edun
(74) *Attorney, Agent, or Firm* — Intellectual Valley Law, P.C.

(57) ABSTRACT

The present application discloses a touch substrate, a display device having the same, and a manufacturing method thereof. The touch substrate comprises a touch electrode and a diffusive reflector disposed on the touch electrode.

20 Claims, 5 Drawing Sheets

(56) References Cited

FOREIGN PATENT DOCUMENTS

| | | |
|---|---|---|
| JP | 2013142966 A | 7/2013 |
| JP | 2014005341 A | 1/2014 |
| JP | 2014089308 A | 5/2014 |

OTHER PUBLICATIONS

The First Office Action in the Chinese Patent Application No. 201510266857.2, dated May 17, 2017; English translation attached.
The Second Office Action in the Chinese Patent Application No. 201510266857.2, dated Dec. 4, 2017; English translation attached.
The Third Office Action in the Chinese Patent Application No. 201510266857.2, dated Apr. 10, 2018; English translation attached.

* cited by examiner

```
┌─────────────────────────────┐
│  Forming a plurality of touch│
│        electrodes           │
└─────────────────────────────┘
              │
              ▼
┌─────────────────────────────┐
│   Forming a plurality of    │
│ diffusive reflectors disposed│
│   on the touch electrode    │
└─────────────────────────────┘
```

TOUCH SUBSTRATE, DISPLAY DEVICE HAVING THE SAME, AND MANUFACTURING METHOD THEREOF

CROSS-REFERENCE TO RELATED APPLICATION

This application is a national stage application under 35 U.S.C. § 371 of International Application No. PCT/CN2015/096900 filed Dec. 10, 2015, which claims priority to Chinese Patent Application No. 201510266857.2, filed May 22, 2015, the contents of which are incorporated by reference in the entirety.

FIELD

The present invention relates to display technology, and more particularly, to a touch substrate, a display device having the same, and a manufacturing method thereof.

BACKGROUND

Conventional touch devices can be generally categorized into resistive, capacitive, optical, sound wave, and electromagnetic designs. In recent years, touch devices have been widely used in many electronic devices such as mobile phones, computer display panels, touch screens, satellite navigation devices, digital cameras, etc. In conventional capacitive touch devices, the point on the display panel touched by a finger is detected by detecting the change in the capacitance of the capacitor coupled with the finger through a touch sensing electrode, and thus, the point is reflected in the image display. When a metal touch electrode is used, the reflection by the metal may affect display quality.

SUMMARY

In one aspect, the present invention provides a touch substrate comprising a touch electrode and a diffusive reflector disposed on the touch electrode. Optionally, the diffusive reflector comprises one or more units, each of which has a shape selected from a group consisting of hemisphere, cone, conical frusta, pyramid, and pyramidal frusta. Optionally, the diffusive reflector comprises one or more units, each of which is a rod-shaped object having a cross-section selected from a group consisting of trapezoid, semicircle, and triangle. Optionally, the diffusive reflector has a total specular reflectance of less than 40%. Optionally, the diffusive reflector is made of a material selected from a group consisting of Molybdenum, Molybdenum alloy, and Molybdenum alloy oxide. Optionally, the touch electrode comprises a plurality of parallel first electrodes and a plurality of parallel second electrodes, and the plurality of first electrodes and the plurality of second electrodes intersect each other and are insulated from each other. Optionally, the plurality of first electrodes and the plurality of second electrodes are made of metal. Optionally, the diffusive reflector and the second electrodes are made of different materials. Optionally, the plurality of first electrodes are transparent electrodes, each of the plurality of second electrodes comprises a transparent electrode portion and a bridge portion, two neighboring transparent electrode portions are spaced apart by the first electrode, the bridge portion connects the two neighboring transparent electrode portions together, the bridge portion is made of metal, and the diffusive reflector is disposed on the bridge portion.

In another aspect, the present invention provides a manufacturing method of a touch substrate. The method comprises forming a plurality of touch electrodes; and forming a plurality of diffusive reflectors disposed on the touch electrode. Optionally, the step of forming the plurality of touch electrodes comprises patterning a plurality of first electrodes; and patterning a plurality of second electrodes. Optionally, the diffusive reflector and the second electrodes are made of different materials. Optionally, the plurality of diffusive reflectors and the plurality of second electrodes are patterned in a same process. Optionally, the step of patterning the plurality of second electrodes comprises sequentially forming a metal layer and a diffusive reflective layer, and coating a photoresist layer on the diffusive reflective layer to be patterned; exposing the photoresist layer with a gray-tone mask plate or a half-tone mask plate; developing the exposed photoresist layer to obtain a photoresist pattern, wherein the photoresist pattern comprises: a first section corresponding to the second electrodes, and a second section which is outside of the first section; the first section comprises a first zone corresponding to the diffusive reflectors, and a second zone corresponding to remaining parts of the first section; the depth of the first zone is larger than that of the second zone, and the photoresist material is removed in the second section; etching the diffusive reflective layer in the second section, exposing the metal layer in the second section, thereby forming a diffusive reflective layer pattern corresponding to the second electrodes; etching the metal layer in the second section thereby forming the second electrode pattern; ashing the photoresist layer thereby removing the photoresist layer in the second zone while maintaining the photoresist layer in the first zone; etching the diffusive reflective layer in the second zone, exposing the metal layer in the second zone, thereby forming a diffusive reflective layer pattern corresponding to the first zone; and removing the photoresist pattern in the first zone. Optionally, the step of patterning the plurality of second electrodes comprises sequentially forming a metal layer, an overcoat layer, and a diffusive reflective layer, and coating a photoresist layer on the diffusive reflective layer to be patterned; exposing the photoresist layer with a gray-tone mask plate or a half-tone mask plate; developing the exposed photoresist layer to obtain a photoresist pattern, wherein the photoresist pattern comprises: a first section corresponding to the second electrodes, and a second section which is outside of the first section; the first section comprises a first zone corresponding to the diffusive reflectors, and a second zone corresponding to remaining parts of the first section; the depth of the first zone is larger than that of the second zone, and the photoresist material is removed in the second section; etching the diffusive reflective layer in the second section, exposing the overcoat layer in the second section, thereby forming a diffusive reflective layer pattern corresponding to the second electrodes; etching the metal layer and the overcoat layer in the second section thereby forming the second electrode pattern; ashing the photoresist layer thereby removing the photoresist layer in the second zone while maintaining the photoresist layer in the first zone; etching the diffusive reflective layer in the second region, thereby forming a diffusive reflective layer pattern corresponding to the second electrodes; and removing the photoresist pattern in the first zone. Optionally, the plurality of touch electrodes comprise a plurality of first electrodes and a plurality of second electrodes, the plurality of first electrodes are transparent electrodes, each of the plurality of second electrodes comprises a transparent electrode portion spaced apart by the plurality of first electrodes and a bridge portion connecting neighboring transparent electrode portions together, the bridge portion is made of metal, and the diffusive reflector is disposed on the bridge portion; the step of forming the plurality of touch electrodes comprises: patterning the plurality of first electrodes and the transparent electrode portions of the plurality of second electrodes; and patterning the bridge portions of the plurality of second electrodes; wherein the plurality of diffusive reflectors and the bridge portions of the plurality of second electrodes are patterned in a same process. Optionally, the step of patterning the bridge portions of the plurality of second electrodes comprises sequentially forming a metal layer and a diffusive reflective layer, and coating a photoresist layer on the diffusive reflective layer to be patterned; exposing the photoresist layer with a gray-tone mask plate or a half-tone mask plate; developing the exposed photoresist layer to obtain a photoresist pattern, wherein the photoresist pattern comprises a first section corresponding to the bridge portions, and a second section which is outside of the first section; the first section comprises a first zone corresponding to the diffusive reflectors, and a second zone corresponding to remaining parts of the first section; the depth of the first zone is larger than that of the second zone, and the photoresist material is removed in the second section; etching the diffusive reflective layer in the second section, exposing the metal layer in the second section, thereby forming a diffusive reflective layer pattern corresponding to the bridge portions; etching the metal layer in the second section thereby forming the bridge portion pattern; ashing the photoresist layer thereby removing the photoresist layer in the second zone while maintaining the photoresist layer in the first zone; etching the diffusive reflective layer in the second zone, exposing the metal layer in the second zone, thereby forming a diffusive reflective layer pattern corresponding to the first zone; and removing the photoresist pattern in the first zone. Optionally, the step of patterning the bridge portions of the plurality of second electrodes comprises sequentially forming a metal layer, an overcoat layer, and a diffusive reflective layer, and coating a photoresist layer on the diffusive reflective layer to be patterned; exposing the photoresist layer with a gray-tone mask plate or a half-tone mask plate; developing the exposed photoresist layer to obtain a photoresist pattern, wherein the photoresist pattern comprises a first section corresponding to the bridge portions, and a second section which is outside of the first section; the first section comprises a first zone corresponding to the diffusive reflectors, and a second zone corresponding to remaining parts of the first section; the depth of the first zone is larger than that of the second zone, and the photoresist material is removed in the second section; etching the diffusive reflective layer in the second section, exposing the overcoat layer in the second section, thereby forming a diffusive reflective layer pattern corresponding to the bridge portions; etching the metal layer and the overcoat layer in the second section thereby forming the bridge portion pattern; ashing the photoresist layer thereby removing the photoresist layer in the second zone while maintaining the photoresist layer in the first zone; etching the diffusive reflective layer in the second region, thereby forming a diffusive reflective layer pattern corresponding to the bridge portions; and removing the photoresist pattern in the first zone. Optionally, the diffusive reflective layer is etched by dry etching and the metal layer is etched by wet etching; or the diffusive reflective layer is etched by wet etching and the metal layer is etched by dry etching. Optionally, the diffusive reflective layer and the overcoat layer are both etched by wet etching, at least one wet etching solution can be selected which is effective for etching the diffusive reflective layer but which is not effective for etching the overcoat layer, and at least one wet etching solution can be selected which is effective for etching the overcoat layer but which is not effective for etching the diffusive reflection layer.

In another aspect, the present invention provides a display device comprising the touch substrate described herein or a display device comprising a touch substrate manufactured by a method described herein.

BRIEF DESCRIPTION OF THE FIGURES

The following drawings are merely examples for illustrative purposes according to various disclosed embodiments and are not intended to limit the scope of the present invention.

DETAILED DESCRIPTION OF THE EMBODIMENTS

The disclosure will now describe more specifically with reference to the following embodiments. It is to be noted that the following descriptions of some embodiments are presented herein for purpose of illustration and description only. It is not intended to be exhaustive or to be limited to the precise form disclosed.

Figure 1:
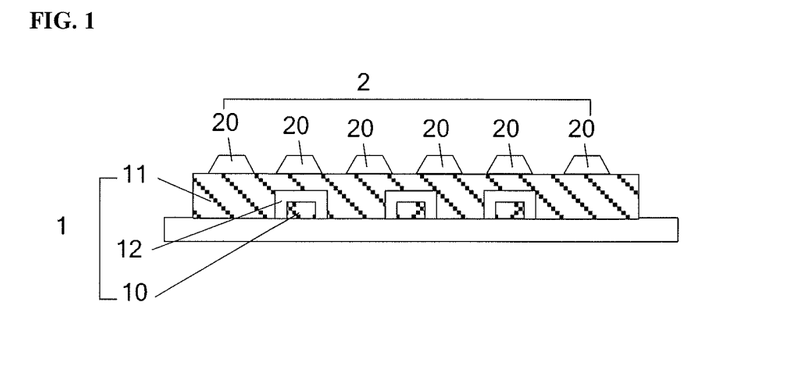
FIG. 1 is a diagram illustrating the structure of a touch substrate according to an embodiment.

FIG. 1 is a diagram illustrating the structure of a touch substrate according to an embodiment. Referring to FIG. 1, the touch substrate in the embodiment includes a touch electrode 1. One or more surfaces, e.g., the top surface or the side surfaces, of the touch electrode may reflect incident light. The touch substrate in the embodiment further includes a diffusive reflector 2 disposed on the touch electrode 1. The diffusive reflector 2 reduces or even eliminates specular reflectance, and reflects light by diffuse reflectance, thereby improves display quality. As used herein, the term "specular reflectance" refers to a concept usefully described with reference to the term "specular reflection". "Specular reflection" or "specularly reflected" refers to the mirror-like reflection of light whereupon light from a single incident direction is reflected into a single outgoing direction, with both directions making the same angle with respect to the surface. "Specular reflectance" refers to the fraction, expressed as a percent, of the incoming light intensity that is specularly reflected by a surface. Specular reflectance can be a function of the wavelength of the incident light. As used herein, the term "total specular reflectance" refers to a total specular reflectance in a specific wavelength range. For example, the total specular reflectance may be a total specular reflectance at a wavelength of about 380 nm to about 780 nm. As used herein, the term "diffuse reflectance" refers to a concept usefully described with reference to the term "diffuse reflection". "Diffuse reflection" or "diffusely reflected" refers to the non-specular reflection of light whereupon light from a single incident direction is reflected into outgoing directions that do not include the specular direction. "Diffuse reflectance" refers to the fraction, expressed as a percent, of the incoming light intensity that is diffusely reflected by a surface. Diffuse reflectance can be a function of the wavelength of the incident light. As used herein, the term "total diffuse reflectance" refers to a total diffuse reflectance in a specific wavelength range. For example, the total diffuse reflectance may be a total diffuse reflectance at a wavelength of about 380 nm to about 780 nm.

Referring to FIG. 1, the diffusive reflector 2 includes one or more units 20 for diffusely reflecting light to various directions other than the specular reflection direction. The diffusive reflector units 20 can be of any suitable shape, for example, hemisphere, cone, conical frusta, pyramid, pyramidal frusta, cube, sphere, spherical cap, rectangular prism, cylinder, a rod-shaped object, and so on. Optionally, the rod-shaped object has a cross-section selected from a group consisting of trapezoid, semicircle, triangle, square, ellipse, rectangle, parallelogram, half circle, and half ellipse.

Based on the above, the diffusive reflector 2 (and the touch electrode 1) in some embodiments has a total specular reflectance of higher than 0% and less than 40%, e.g., higher than 0% and less than 35%, higher than 0% and less than 30%, higher than 0% and less than 25%, higher than 0% and less than 20%, higher than 0% and less than 15%, higher than 0% and less than 10%, higher than 0% and less than 5%, 1-40%, 1-35%, 1-30%, 1-25%, 1-20%, 1-15%, 1-10%, 1-5%, or 5-30%. Optionally, the total specular reflectance is measured at a wavelength of about 380 nm to about 780 nm. Optionally, the total specular reflectance is measured at a wavelength of about 600 nm.

Figure 2:
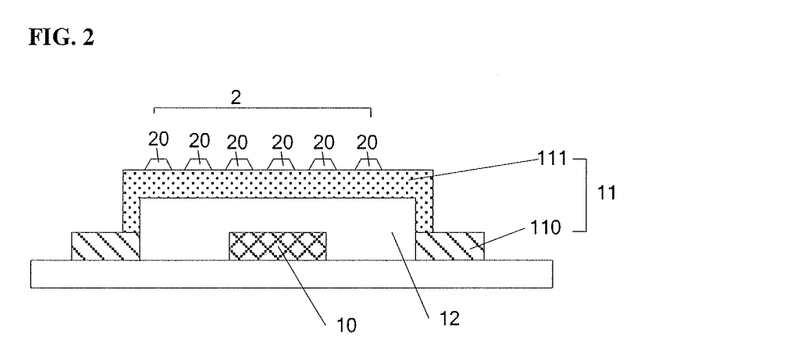
FIG. 2 is a diagram illustrating the structure of a touch substrate according to another embodiment.
Figure 3:
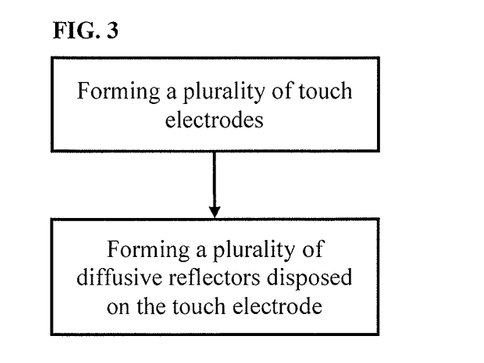
FIG. 3 is a flow chart illustrating a manufacturing method of a touch substrate according to one embodiment.

Referring to FIG. 1, the touch electrode 1 in the embodiment includes a plurality of parallel first electrodes 10 and a plurality of parallel second electrodes 11. The plurality of first electrodes 10 and the plurality of second electrodes 11 intersect each other and are insulated from each other by an insulating layer 12. In the embodiment as shown in FIG. 1, the first electrode 10 and the second electrode 11 are made of reflective materials such as a metal. Therefore, both the first electrode 10 and the second electrode 11 may reflect incident light. The electrodes can be made of a non-reflective material. Referring to FIG. 2, the first electrode 10 of the embodiment is a transparent electrode. The second electrode 11 includes a transparent electrode portion 110 spaced apart by the first electrodes 10 and a bridge portion 111 connecting neighboring transparent electrode portions 110 together. In the embodiment as shown in FIG. 3, the bridge portion 111 is made of a metal material. The bridge portion 111 may reflect incident light. The diffusive reflector units 20 can be disposed on the bridge portion 111 to reduce specular reflection.

The diffusive reflector 2 may be disposed on the entire surface of the touch electrode 1 or a portion of the touch electrode 1 (e.g., a bridge portion 111). Optionally, the diffusive reflector 2 is disposed on a top surface of the touch electrode 1 or a portion thereof. Optionally, the diffusive reflector 2 is disposed on a side surface of the touch electrode 1 or a portion thereof. Optionally, the diffusive reflector 2 is disposed on both a top surface and a side surface of the touch electrode 1 or a portion thereof.

The diffusive reflector 2 can be made of various materials. The diffusive reflector 2 can be made of a material different from or the same as that of the touch electrode 1. Optionally, the diffusive reflector 2 can be made of a material different from that of the touch electrode 1 or a portion thereof (e.g., a bridge portion 111) on which the diffusive reflector 2 is disposed. For example, in the embodiment as shown in FIG. 1, the diffusive reflector 2 can be made of a material different from that of the second electrode 11. In the embodiment as shown in FIG. 2, the diffusive reflector 2 may be made of a material different from that of the bridge portion 111. Optionally, the diffusive reflector 2 can be made of the same material as that of the touch electrode 1 or a portion thereof (e.g., a bridge portion 111) on which the diffusive reflector 2 is disposed. Optionally, the diffusive reflector 2 is made of a material selected from a group consisting of Molybdenum, Molybdenum alloy (e.g., MoTi), and Molybdenum alloy oxide (e.g., MoO, MoTaO, MoNbO).

FIG. 3 is a flow chart illustrating a manufacturing method of a touch substrate according to one embodiment. Referring to FIG. 3, the method in the embodiment includes a step of forming a plurality of touch electrodes 1 and a step of forming a plurality of diffusive reflectors 2 disposed on the touch electrode 1. The touch electrodes 1 in the embodiment are made of a metal material and at least a portion of it may reflect incident light. The touch electrode 1 of FIG. 1 is an example of such touch electrodes. The touch electrode 1 includes a first electrode 10 and a second electrode 11.

Optionally, the method can further include a step of patterning a plurality of first electrodes 10 and a step of patterning a plurality of second electrodes 11. The step of patterning the first electrodes 10 may be performed using a patterning process. For example, a photoresist may be formed on a layer and a mask having a predetermined pattern may be placed on the photoresist layer, followed by UV exposure, development, baking and etching, thereby forming a layer having the first electrodes 10 and the second electrodes 11. The method steps as described herein are not necessarily performed sequentially, and in general can be performed in parallel with each other wherever possible. The step of patterning the second electrodes 11 can be performed using a similar patterning process.

Figure 4:
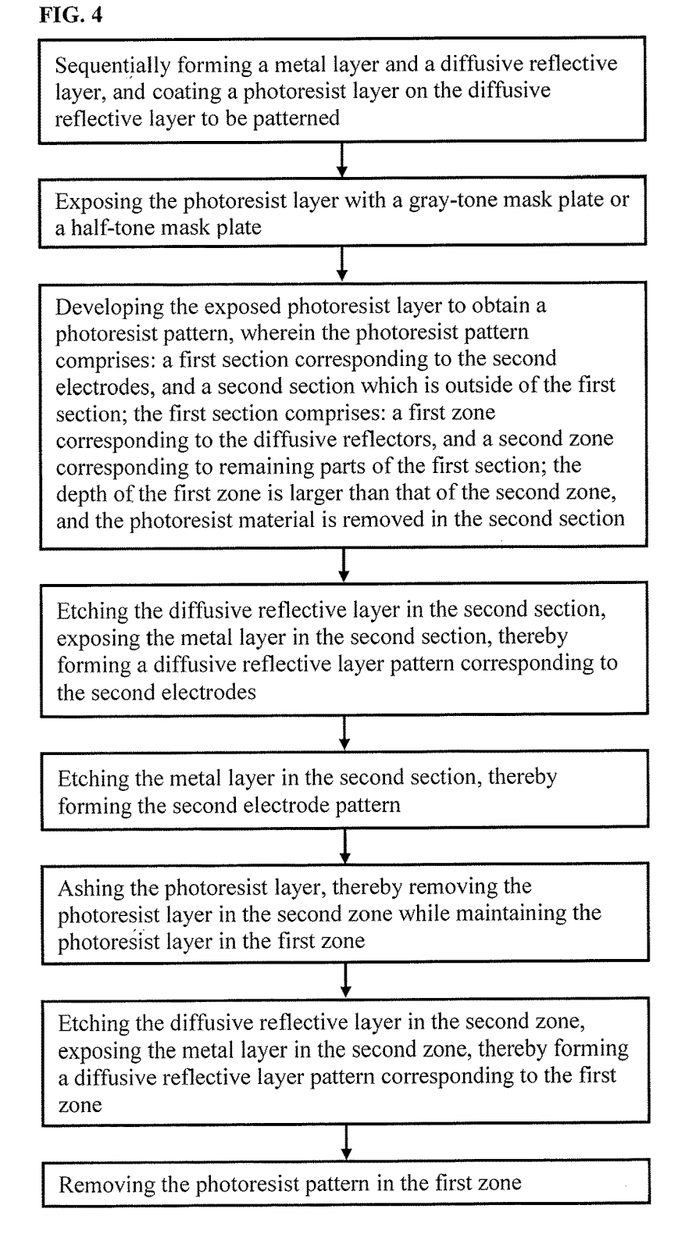
FIG. 4 is a flow chart illustrating a method of patterning diffusive reflectors and second electrodes according to an embodiment.
Figure 5:
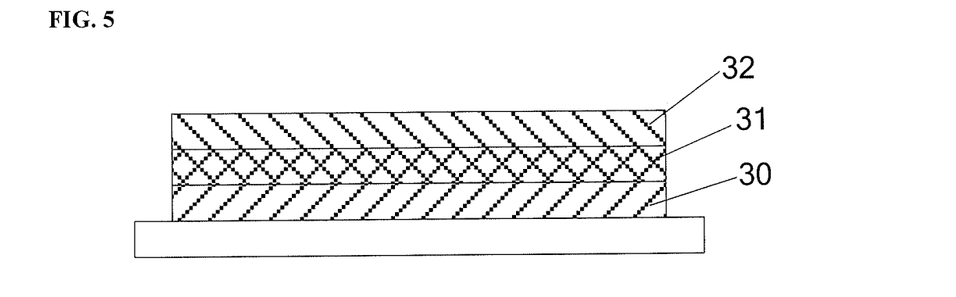
FIGS. 5-9 are diagrams illustrating individual steps of the method as shown in FIG. 4.
Figure 6:
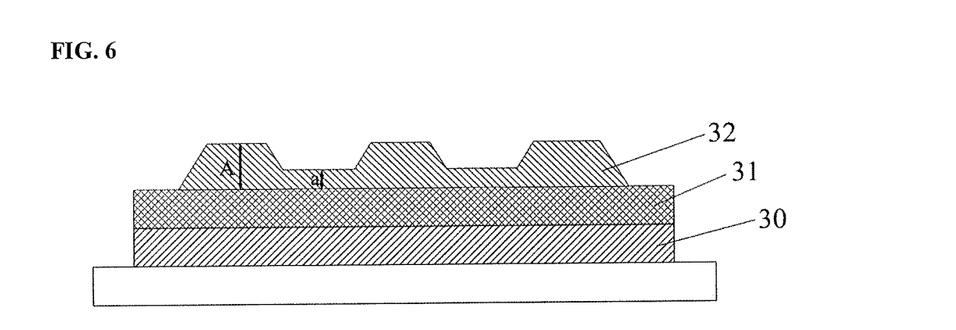
Figure 7:
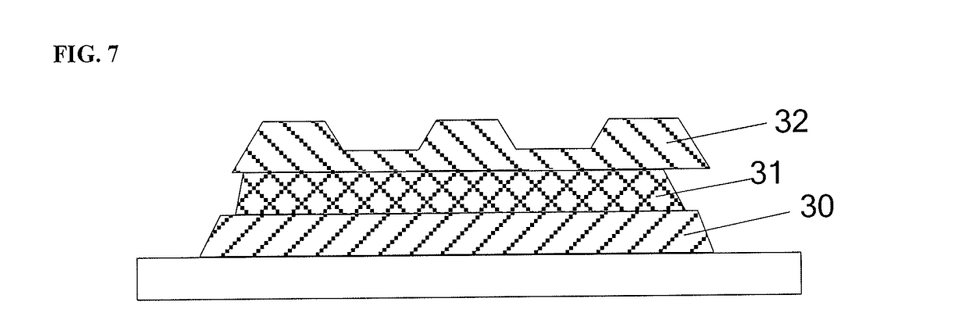
Figure 8:
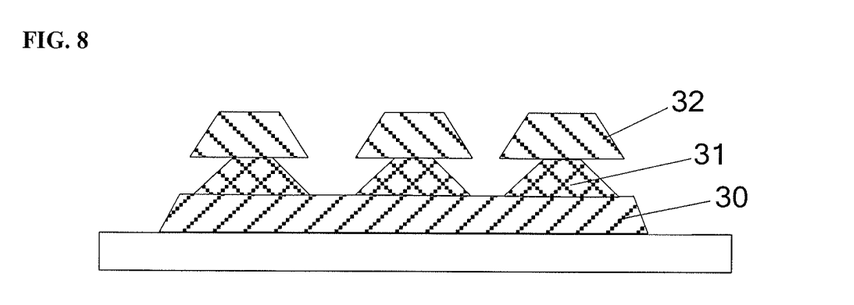
Figure 9:
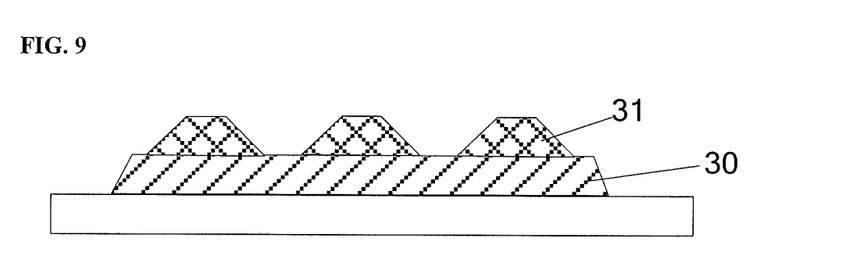

Optionally, the step of patterning a plurality of second electrodes 11 may be performed solely for patterning the second electrodes 11. Optionally, the step of patterning the second electrodes 11 can be performed for patterning both the second electrodes 11 and the diffusive reflector 2 in one patterning process. As shown in FIG. 4, the method in some embodiments includes one or more of the following steps:

a step of sequentially forming a metal layer 30 and a diffusive reflective layer 31 and coating a photoresist layer 32 on the diffusive reflective layer 31 to be patterned, as shown in FIG. 5;

a step of exposing the photoresist layer 32 with a gray-tone mask plate or a half-tone mask plate;

a step of developing the exposed photoresist layer 32 to obtain a photoresist pattern, wherein the photoresist pattern comprises: a first section corresponding to the second electrodes; and a second section which is outside of the first section. The first section comprises a first zone corresponding to the diffusive reflectors; and a second zone corresponding to remaining parts of the first section. The depth of the first zone is larger than that of the second zone, and the photoresist material is removed in the second section as shown in FIG. 6;

a step of etching the diffusive reflective layer 31 in the second section, and exposing the metal layer 30 in the second section, thereby forming a diffusive reflective layer pattern corresponding to the second electrodes 11;

a step of etching the metal layer 30 in the second section thereby forming the second electrode 11 pattern, as shown in FIG. 7;

a step of ashing the photoresist layer thereby removing the photoresist layer in the second zone while maintaining the photoresist layer in the first zone;

a step of etching the diffusive reflective layer in the second zone, exposing the metal layer in the second zone, thereby forming a diffusive reflective layer pattern corresponding to the first zone, as shown in FIG. 8; and a step of removing the photoresist pattern in the first zone, as shown in FIG. 9.

Optionally, when one of the diffusive reflective layer 31 and the metal layer 30 is etched by dry etching, the other is etched by wet etching, or vice versa. For example, when the diffusive reflective layer 31 is etched by dry etching, the metal layer 30 is etched by wet etching. When the diffusive reflective layer 31 is etched by wet etching, the metal layer 30 is etched by dry etching. In some embodiments, one of the diffusive reflective layer 31 and the metal layer 30 is made of a first material susceptible to dry etching and resistant to wet etching, the other one is made of a different, second material susceptible to wet etching but resistant to dry etching. Optionally, the first material is Molybdenum, and the second material is Aluminum.

Figure 10:
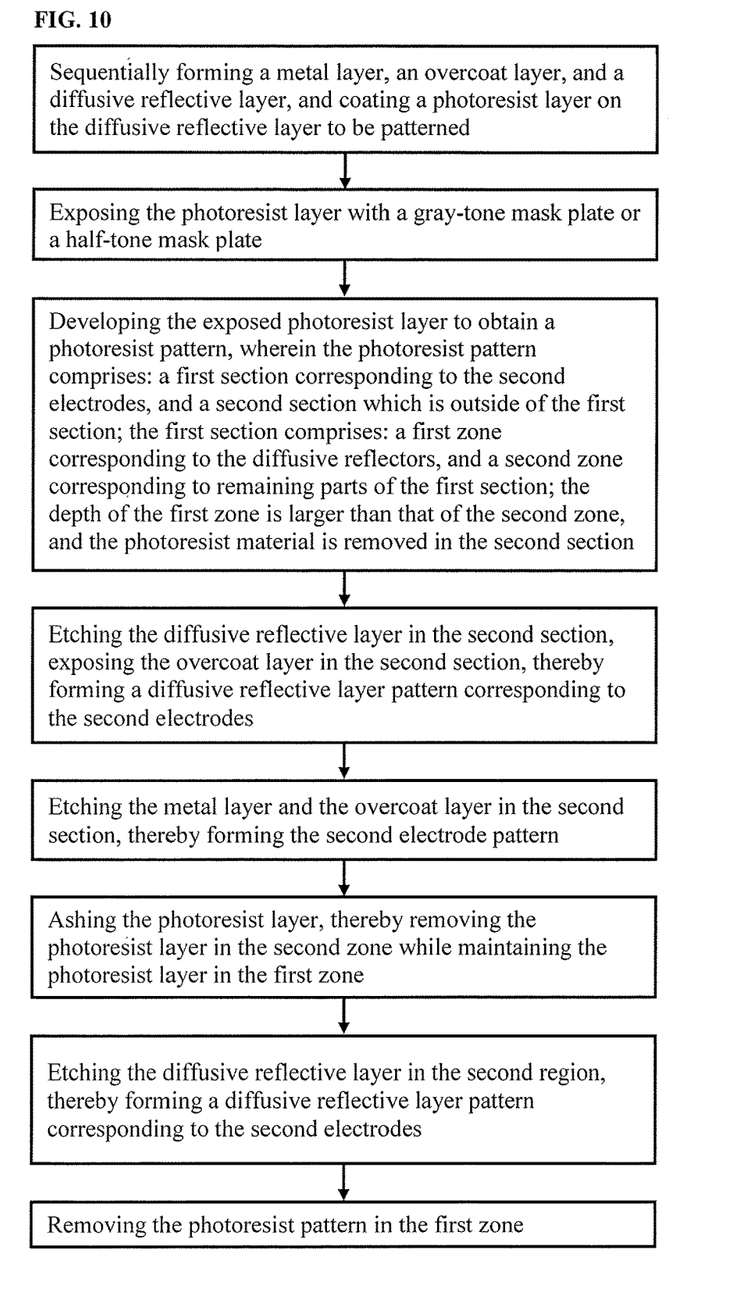
FIG. 10 is a flow chart illustrating a method of patterning diffusive reflectors and second electrodes according to another embodiment.

FIG. 10 is a flow chart illustrating a method of patterning diffusive reflectors and second electrodes according to another embodiment. Referring to FIG. 10, the step of patterning the second electrodes 11 in the embodiment includes one or more of the following steps:

a step of sequentially forming a metal layer, an overcoat layer, and a diffusive reflective layer, and coating a photoresist layer on the diffusive reflective layer to be patterned;

a step of exposing the photoresist layer with a gray-tone mask plate or a half-tone mask plate;

a step of developing the exposed photoresist layer 32 to obtain a photoresist pattern, wherein the photoresist pattern comprises a first section corresponding to the second electrodes and a second section which is outside of the first section. The first section comprises a first zone corresponding to the diffusive reflectors and a second zone corresponding to remaining parts of the first section. The depth of the first zone is larger than that of the second zone, and the photoresist material is removed in the second section;

a step of etching the diffusive reflective layer in the second section, exposing the overcoat layer in the second section, thereby forming a diffusive reflective layer pattern corresponding to the second electrodes;

a step of etching the metal layer and the overcoat layer in the second section thereby forming the second electrode pattern;

a step of ashing the photoresist layer thereby removing the photoresist layer in the second zone while maintaining the photoresist layer in the first zone;

a step of etching the diffusive reflective layer in the second region, thereby forming a diffusive reflective layer pattern corresponding to the second electrodes; and a step of removing the photoresist pattern in the first zone.

The overcoat layer between the metal layer and the diffusive reflective layer protects the metal layer from being etched during the step of etching the diffusive reflective layer. Optionally, the diffusive reflective layer and the overcoat layer can both be etched by wet etching. When they are both etched by wet etching, different wet etching solutions are selected for etching each of the layers so that each etch solution is specific for only one layer and does not etch the other layer. The materials of the metal and diffusive reflective layer should be selected so that at least one wet etching solution can be selected which is effective for etching the diffusive reflective layer but which is not effective for etching the overcoat layer, and/or at least one wet etching solution can be selected which is effective for etching the overcoat layer but which is not effective for etching the diffusive reflection layer. For example, the diffusive reflective layer can be made of copper or copper alloy, and the overcoat layer can be made of Molybdenum or Molybdenum alloy, or Niobium or niobium alloy. The solution for etching diffusive reflective layer can be a non-acid etching solution (e.g., a hydrogen dioxide containing solution), which does not etch Molybdenum or Niobium, or alloys thereof. As such, the overcoat layer will not be etched during the step of etching the diffusive reflective layer.

Depending on the types of touch electrodes, variations and equivalents methods can be adopted for manufacturing the touch electrodes having a diffusive reflector. FIG. 2 shows a touch electrode having a transparent first electrode 10 and a second electrode 11 including a transparent electrode portion 110 spaced apart by the first electrodes 10 and a bridge portion 111 connecting neighboring transparent electrode portions together. In some embodiments, the bridge portion is made of metal, and the diffusive reflector is disposed on the bridge portion 111. Optionally, the manufacturing method of a touch electrode includes one or more of the following steps: patterning the plurality of first electrodes 10 and the transparent electrode portions 110 of the plurality of second electrodes 11, and patterning the bridge portions 111 of the plurality of second electrodes 11. Optionally, the diffusive reflectors and the bridge portions 111 of the second electrodes 11 are patterned in a same patterning process.

The steps of patterning the first electrodes 10 and the transparent electrode portions 110 of the second electrodes 11 may be performed using a patterning process. For example, a photoresist may be formed on a layer and a mask having a predetermined pattern may be placed on the photoresist layer, followed by UV exposure, development, baking and etching, thereby forming a layer having the first electrodes 10 and the transparent portion 110 of the second electrodes 11. The method steps as described herein are not necessarily performed sequentially, and in general can be performed in parallel with each other wherever possible. When the step of patterning the bridge portions 111 of the plurality of second electrodes 11 is performed solely for patterning the bridge portions 111, a similar patterning process can be adopted.

Optionally, the step of patterning the bridge portions 111 can be performed for patterning both the bridge portions 111 of the second electrodes 11 and the diffusive reflector 2 in one patterning process. In some embodiments, the method in embodiments includes one or more of the following steps:

a step of sequentially forming a metal layer and a diffusive reflective layer, and coating a photoresist layer on the diffusive reflective layer to be patterned;

exposing the photoresist layer with a gray-tone mask plate or a half-tone mask plate;

developing the exposed photoresist layer to obtain a photoresist pattern, wherein the photoresist pattern comprises a first section corresponding to the bridge portions and a second section which is outside of the first section. The first section comprises a first zone corresponding to the diffusive reflectors; and a second zone corresponding to remaining parts of the first section. The depth of the first zone is larger than that of the second zone, and the photoresist material is removed in the second section;

etching the diffusive reflective layer in the second section, exposing the metal layer in the second section, thereby forming a diffusive reflective layer pattern corresponding to the bridge portions;

etching the metal layer in the second section thereby forming the bridge portion pattern;

ashing the photoresist layer thereby removing the photoresist layer in the second zone while maintaining the photoresist layer in the first zone;

etching the diffusive reflective layer in the second zone, exposing the metal layer in the second zone, thereby forming a diffusive reflective layer pattern corresponding to the first zone; and removing the photoresist pattern in the first zone.

Optionally, when one of the diffusive reflective layer 31 and the metal layer 30 is etched by dry etching, the other is etched by wet etching, or vice versa. For example, when the diffusive reflective layer 31 is etched by dry etching, the metal layer 30 is etched by wet etching. When the diffusive reflective layer 31 is etched by wet etching, the metal layer 30 is etched by dry etching. In some embodiments, one of the diffusive reflective layer 31 and the metal layer 30 is made of a first material susceptible to dry etching and resistant to wet etching, the other one is made of a different, second material susceptible to wet etching but resistant to dry etching. Optionally, the first material is Molybdenum, and the second material is Aluminum.

In some embodiments, an overcoat layer is included between the metal layer and the diffusive reflective layer. Optionally, the step of patterning the bridge portions of the plurality of second electrodes and the plurality of diffusive reflectors includes one or more of the following steps:

a step of sequentially forming a metal layer, an overcoat layer, and a diffusive reflective layer, and coating a photoresist layer on the diffusive reflective layer to be patterned;

a step of exposing the photoresist layer with a gray-tone mask plate or a half-tone mask plate;

a step of developing the exposed photoresist layer to obtain a photoresist pattern, wherein the photoresist pattern comprises a first section corresponding to the bridge portions; and a second section which is outside of the first section. The first section comprises a first zone corresponding to the diffusive reflectors; and a second zone corresponding to remaining parts of the first section. The depth of the first zone is larger than that of the second zone, and the photoresist material is removed in the second section;

a step of etching the diffusive reflective layer in the second section, exposing the overcoat layer in the second section, thereby forming a diffusive reflective layer pattern corresponding to the bridge portions;

a step of etching the metal layer and the overcoat layer in the second section thereby forming the bridge portion pattern;

a step of ashing the photoresist layer thereby removing the photoresist layer in the second zone while maintaining the photoresist layer in the first zone;

a step of etching the diffusive reflective layer in the second region, thereby forming a diffusive reflective layer pattern corresponding to the bridge portions; and a step of removing the photoresist pattern in the first zone.

The overcoat layer between the metal layer and the diffusive reflective layer protects the metal layer from being etched during the step of etching the diffusive reflective layer. Optionally, the diffusive reflective layer and the overcoat layer can both be etched by wet etching. When they are both etched by wet etching, different wet etching solutions are selected for etching each of the layers so that each etch solution is specific for only one layer and does not etch the other layer. The materials of the metal and diffusive reflective layer should be selected so that at least one wet etching solution can be selected which is effective for etching the diffusive reflective layer but which is not effective for etching the overcoat layer, and/or at least one wet etching solution can be selected which is effective for etching the overcoat layer but which is not effective for etching the diffusive reflection layer. For example, the diffusive reflective layer can be made of copper or copper alloy, and the overcoat layer can be made of Molybdenum or Molybdenum alloy, or Niobium or niobium alloy. The solution for etching diffusive reflective layer can be a non-acid etching solution (e.g., a hydrogen dioxide containing solution), which does not etch Molybdenum or Niobium, or alloys thereof. As such, the overcoat layer will not be etched during the step of etching the diffusive reflective layer.

The present invention also provides a display device comprising the touch substrate described herein or a display device manufactured by the method described herein.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A touch substrate, comprising:
a first touch electrode layer;
a second touch electrode layer;
an insulating layer insulating the first touch electrode layer and the second touch electrode layer from each other; and
a diffusive reflector disposed on a side of the second touch electrode layer facing away the insulating layer.

2. The touch substrate of claim 1, wherein the diffusive reflector comprises a plurality of units, each of which has a shape selected from a group consisting of hemisphere, cone, conical frusta, pyramid, and pyramidal frusta.

3. The touch substrate of claim 1, wherein the diffusive reflector comprises one or more units, each of which is a rod-shaped object having a cross-section selected from a group consisting of trapezoid, semicircle, and triangle.

4. The touch substrate of claim 1, wherein the diffusive reflector has a total specular reflectance of less than approximately 40%.

5. A display device comprising the touch substrate of claim 1.

6. A touch substrate, comprising:
a touch electrode; and
a diffusive reflector disposed on the touch electrode;
wherein the diffusive reflector is made of a material selected from a group consisting of Molybdenum, Molybdenum alloy, and Molybdenum alloy oxide.

7. The touch substrate of claim 1, wherein the first touch electrode layer comprises a plurality of first electrodes;
the second touch electrode layer comprises a plurality of second electrodes;
the plurality of first electrodes and the plurality of second electrodes intersect each other thereby forming a plurality of intersections; and
the plurality of first electrodes and the plurality of second electrodes are insulated from each other by the insulating layer.

8. The touch substrate of claim 7, wherein the plurality of first electrodes and the plurality of second electrodes are made of metal.

9. The touch substrate of claim 8, wherein the diffusive reflector and the plurality of second electrodes are made of different materials.

10. The touch substrate of claim 7, wherein the plurality of first electrodes are transparent electrodes, each of the plurality of second electrodes comprises a transparent electrode portion and a bridge portion, two neighboring transparent electrode portions are spaced apart by one of the plurality of first electrodes, the bridge portion connects the two neighboring transparent electrode portions together, the bridge portion is made of metal, and the diffusive reflector is disposed on a side of the bridge portion facing away the insulating layer.

11. A method of fabricating a touch substrate, comprising:
forming a first touch electrode layer;
forming a second touch electrode layer;
forming an insulating layer insulating the first touch electrode layer and the second touch electrode layer from each other; and
forming a diffusive reflector on a side of the second touch electrode layer facing away the insulating layer.

12. The method of claim 11, wherein forming the first touch electrode layer comprises forming a plurality of first electrodes;
forming the second touch electrode layer comprises forming a plurality of second electrodes; and
the diffusive reflector and the plurality of second electrode are made of different materials, and are formed in a same patterning process.

13. The method of claim 12, wherein forming the plurality of second electrodes comprises:
sequentially forming a metal layer and a diffusive reflective layer, and coating a photoresist layer on the diffusive reflective layer to be patterned;
exposing the photoresist layer with a gray-tone mask plate or a half-tone mask plate;
developing exposed photoresist layer to obtain a photoresist pattern, wherein the photoresist pattern comprises:
a first section corresponding to the plurality of second electrodes; and
a second section which is outside of the first section;
the first section comprising:
a first zone corresponding to the diffusive reflector; and
a second zone corresponding to remaining parts of the first section;
wherein a depth of the first zone is larger than that of the second zone, and photoresist material is removed in the second section;
etching the diffusive reflective layer in the second section, exposing the metal layer in the second section, thereby forming a diffusive reflective layer pattern corresponding to the plurality of second electrodes;
etching the metal layer in the second section, thereby forming a second electrode pattern;
ashing the photoresist layer, thereby removing the photoresist layer in the second zone while maintaining the photoresist layer in the first zone;
etching the diffusive reflective layer in the second zone, exposing the metal layer in the second zone, thereby forming a diffusive reflective layer pattern corresponding to the first zone; and
removing the photoresist pattern in the first zone.

14. The method of claim 13, wherein the diffusive reflective layer is etched by dry etching and the metal layer is etched by wet etching; or the diffusive reflective layer is etched by wet etching and the metal layer is etched by dry etching.

15. The method of claim 12, wherein forming the plurality of second electrodes comprises:
sequentially forming a metal layer, an overcoat layer, and a diffusive reflective layer, and coating a photoresist layer on the diffusive reflective layer to be patterned;
exposing the photoresist layer with a gray-tone mask plate or a half-tone mask plate;
developing exposed photoresist layer to obtain a photoresist pattern, wherein the photoresist pattern comprises:
a first section corresponding to the plurality of second electrodes; and
a second section which is outside of the first section;
the first section comprising:
a first zone corresponding to the diffusive reflector; and
a second zone corresponding to remaining parts of the first section;
wherein, a depth of the first zone is larger than that of the second zone, and photoresist material is removed in the second section;
etching the diffusive reflective layer in the second section, exposing the overcoat layer in the second section, thereby forming a diffusive reflective layer pattern corresponding to the plurality of second electrodes;
etching the metal layer and the overcoat layer in the second section, thereby forming a second electrode pattern;
ashing the photoresist layer, thereby removing the photoresist layer in the second zone while maintaining the photoresist layer in the first zone;

etching the diffusive reflective layer in the second section, thereby forming a diffusive reflective layer pattern corresponding to the plurality of second electrodes; and removing the photoresist pattern in the first zone.

16. The method of claim 15, wherein the diffusive reflective layer and the overcoat layer are both etched by wet etching, at least one wet etching solution is selectable which is effective for etching the diffusive reflective layer but which is not effective for etching the overcoat layer, and at least one wet etching solution is selectable which is effective for etching the overcoat layer but which is not effective for etching the diffusive reflection layer.

17. The method of claim 11, wherein forming the first touch electrode layer comprise forming a plurality of first electrodes;

forming the second touch electrode layer comprises forming a plurality of second electrodes;

the plurality of first electrodes are transparent electrodes;

each of the plurality of second electrodes comprises a transparent electrode portion and a bridge portion, two neighboring transparent electrode portions are spaced apart by one of the plurality of first electrodes, the bridge portion connects neighboring transparent electrode portions together, the bridge portion is made of metal, and the diffusive reflector is disposed on a side of the bridge portion facing away the insulating layer;

the plurality of first electrodes and transparent electrode portions of the plurality of second electrodes are formed in a same patterning process; and the diffusive reflector and bridge portions of the plurality of second electrodes are formed in a same patterning process.

18. The method of claim 17, wherein forming bridge portions of the plurality of second electrodes and the diffusive reflector comprises:

sequentially forming a metal layer and a diffusive reflective layer, and coating a photoresist layer on the diffusive reflective layer to be patterned;

exposing the photoresist layer with a gray-tone mask plate or a half-tone mask plate;

developing exposed photoresist layer to obtain a photoresist pattern, wherein the photoresist pattern comprises:

a first section corresponding to the bridge portions; and a second section which is outside of the first section;

the first section comprising:

a first zone corresponding to the diffusive reflector; and a second zone corresponding to remaining parts of the first section;

wherein, a depth of the first zone is larger than that of the second zone, and photoresist material is removed in the second section;

etching the diffusive reflective layer in the second section, exposing the metal layer in the second section, thereby forming a diffusive reflective layer pattern corresponding to the bridge portions;

etching the metal layer in the second section, thereby forming a bridge portion pattern;

ashing the photoresist layer, thereby removing the photoresist layer in the second zone while maintaining the photoresist layer in the first zone;

etching the diffusive reflective layer in the second zone, exposing the metal layer in the second zone, thereby forming a diffusive reflective layer pattern corresponding to the first zone; and removing the photoresist pattern in the first zone.

19. The method of claim 17, wherein forming bridge portions of the plurality of second electrodes and the diffusive reflector comprises:

sequentially forming a metal layer, an overcoat layer, and a diffusive reflective layer, and coating a photoresist layer on the diffusive reflective layer to be patterned;

exposing the photoresist layer with a gray-tone mask plate or a half-tone mask plate;

developing exposed photoresist layer to obtain a photoresist pattern, wherein the photoresist pattern comprises:

a first section corresponding to the bridge portions; and a second section which is outside of the first section;

the first section comprising:

a first zone corresponding to the diffusive reflector; and a second zone corresponding to remaining parts of the first section;

wherein, a depth of the first zone is larger than that of the second zone, and photoresist material is removed in the second section;

etching the diffusive reflective layer in the second section, exposing the overcoat layer in the second section, thereby forming a diffusive reflective layer pattern corresponding to the bridge portions;

etching the metal layer and the overcoat layer in the second section, thereby forming a bridge portion pattern;

ashing the photoresist layer, thereby removing the photoresist layer in the second zone while maintaining the photoresist layer in the first zone;

etching the diffusive reflective layer in the second section, thereby forming a diffusive reflective layer pattern corresponding to the bridge portions; and removing the photoresist pattern in the first zone.

20. A display device comprising the touch substrate manufactured by the method of claim 11.

* * * * *